United States Patent
Eng (10) Patent No.: US 8,230,408 B2
(45) Date of Patent: Jul. 24, 2012

(54) EXECUTION OF HARDWARE DESCRIPTION LANGUAGE (HDL) PROGRAMS

(75) Inventor: Tommy Kinming Eng, Pleasanton, CA (US)

(73) Assignee: Coherent Logix, Incorporated, Austin, TX (US)

( * ) Notice: Subject to any disclaimer, the term of this patent is extended or adjusted under 35 U.S.C. 154(b) by 1645 days.

(21) Appl. No.: 11/168,794

(22) Filed: Jun. 28, 2005

(65) Prior Publication Data

US 2006/0005173 A1 Jan. 5, 2006

Related U.S. Application Data

(60) Provisional application No. 60/584,242, filed on Jun. 30, 2004.

(51) Int. Cl.
*G06F 9/45* (2006.01)
(52) U.S. Cl. .......................... 717/149; 717/136; 717/140
(58) Field of Classification Search .................. 717/140, 717/141, 149, 154–257
See application file for complete search history.

(56) References Cited

U.S. PATENT DOCUMENTS

| | | | | |
|---|---|---|---|---|
| 5,903,466 | A * | 5/1999 | Beausang et al. ................ | 716/18 |
| 6,145,117 | A * | 11/2000 | Eng .................................. | 716/18 |
| 6,253,371 | B1 | 6/2001 | Iwasawa | |
| 6,466,898 | B1 | 10/2002 | Chan | |
| 2002/0138244 | A1 * | 9/2002 | Meyer ............................... | 703/14 |
| 2003/0149859 | A1 | 8/2003 | Hyduke | |
| 2003/0191869 | A1 * | 10/2003 | Williams et al. ............... | 709/328 |

FOREIGN PATENT DOCUMENTS

| | | |
|---|---|---|
| GB | 2 276 742 | 10/1994 |
| WO | 0163647 | 8/2001 |

OTHER PUBLICATIONS

International Search Report and Written Opinion for PCT/US2005/022850, mailed Jun. 13, 2006, 17 pages.
European search report for application No. EP 05 762 166.2, mailed Feb. 13, 2008.
Burns, "An Architecture for Verilog Hardware Accelerator," Verilog HDL Conference, IEEE, Feb. 26, 1996, pp. 2-11, XP010159444.
Radhakrishnan, et al., "External Adjustment of Runtime Parameters in Time Warp Synchronized Parallel Simulators," Parallel Processing Symposium, Apr. 1, 1997, pp. 260-266, XP010216791.
International Search Report for PCT/US2005/022850, mailed Mar. 20, 2006, 7 pages.
Chinese office action for application No. 200580021770.3 issued Apr. 18, 2008.

* cited by examiner

*Primary Examiner* — Lewis A Bullock, Jr.
*Assistant Examiner* — Mark Gooray
(74) *Attorney, Agent, or Firm* — Meyertons Hood Kivlin Kowert & Goetzel, P.C.; Jeffrey C. Hood (57) ABSTRACT

In one embodiment, a hardware implementation of an electronic system may be realized by compiling the HDL description into an executable form and executing the processor instructions. By applying data flow separation technique, the operations of the system can be effectively mapped into the instruction set of complex processors for efficient logic evaluation, in some implementations. An array of interconnected processors may be deployed, in some embodiments, to exploit the inherent parallelism in a HDL description.

12 Claims, 7 Drawing Sheets

Connecting a Network of Processors and Memories Using a Crossbar

Program Compilation and Execution Flow

Fig. 8

Instruction Sequencing and Conditional Branching

EXECUTION OF HARDWARE DESCRIPTION LANGUAGE (HDL) PROGRAMS

PRIORITY CLAIM

This application claims benefit of provisional application Ser. No. 60/584,242 titled "Method and System for Execution of Hardware Description Language (HDL) Programs" filed on Jun. 30, 2004.

FIELD OF THE INVENTION

The present invention relates to the hardware realization of electronic systems described in a Hardware Description Language (HDL), and more particularly, relates to the compilation method and multiprocessor architecture for implementing the hardware of an electronic system.

BACKGROUND

The function of modern electronic systems that are intended to be implemented as integrated circuits is often expressed in a Hardware Description Language (HDL). The purpose of the HDL is to provide a high productivity design media for designers to express the functionality of the system in an unambiguous form, which can then be simulated to verify the correctness of the design before reducing the design into hardware. Various techniques exist today to convert such HDL descriptions into an actual hardware implementation.

Conventional approaches to realize hardware implementation of a HDL description are:

1. Custom Application Specific Integrated Circuit (ASIC)

Major custom ASIC implementation steps comprise: 1.) Synthesizing the HDL into a lower level description (e.g., a gate level netlist) that can be mapped into hardware logic functional blocks; 2.) Placing the logic function blocks to minimize routing delay between them; 3.) Creating the routing to interconnect blocks; 4.) Verifying the functionality, timing, power consumption, and signal integrity of the design using Electronic Design Automation (EDA) software tools; 5.) Creating a mask set for an ASIC or multiple ASICs; and 5.) Fabricating the chip.

The advantages of ASIC implementation are: high performance, small die size (low cost), and low power consumption, at the expense of high nonrecurring engineering (NRE) cost, high risk, and long design time.

2. Field Programmable Gate Array (FPGA)

FPGAs are programmable devices in which the device function is defined by the program downloaded (as a bit stream) into an on-board storage. An FPGA is made up of programmable logic function blocks and programmable wires for connecting functional blocks.

Similarly to the custom ASIC approach, the HDL description is synthesized into logic function blocks already built into the base array of the FPGA. The FPGA design software creates a bit stream used to configure the programmable function blocks and wires to perform the specific function required by the design.

Unlike the ASIC approach, no custom physical implementation is required in the FPGA approach. The FPGA approach offers fast turn around and low design cost and risk, but at the expense of higher device cost, lower performance, and higher power consumption than custom ASICs.

ASICs and FPGAs are direct hardware mapping approaches in which the logic function contained in the HDL description is implemented directly by corresponding logic gates in the underlying hardware. An alternate approach to the direct mapping technique is the so-called processor-based logic evaluation approach (e.g. accelerators or emulators).

In the processor-based approach, logic values are computed using clusters of "processors". While the literature refers to the computing elements as processors, they are actually primitive computing elements to which a single command can be dispatched. In response to the command and corresponding operands, if any, the primitive computing element returns a result. For example, logic computing elements such as AND, OR, shift, etc. are implemented. Adder computing elements that add or subtract operands are sometimes implemented. In some cases, the "processors" may be of the complexity of a 4-input function look-up table. However, the "processors" are not processors in the general purpose processor sense, and do not independently execute programs. The HDL description is compiled into an instruction stream which routes data from memory to and from various processors for evaluation. Simple "processors" create complex interconnect (heavy data traffic) requirements and long execution time because complex logic functions require multiple processors and multiple clock cycles to execute.

Prior attempts to apply complex (e.g. general purpose) processors have been problematic due to the fact that the HDL description has always been synthesized into low level primitive logic functions. For example, in the conventional "processor"-based approach the compiler decomposes the HDL description into a collection of primitive logic operations and then schedules the execution of these operations by various "processors". The results of each primitive operation often need to be stored and then retrieved later to be use as the input operand of subsequent logic evaluation. The heavy data traffic in the conventional "processor"-based approach is the Achilles' heel of performance and power consumption.

There has been no effective technique to map primitive logic functions into the complex instruction set of a general purpose processor. As a result, processor-based logic evaluation techniques often employ simple "processors", seldom meet the performance, power consumption or cost requirements of the system, and are not a viable alternative to ASICs or FPGAs to realize the design. Therefore, the processor-based approach has been relegated to a logic evaluation technique mostly used in logic emulation and simulation acceleration systems to verify the HDL before hardware implementation in a custom ASIC. This is because lower speed, higher power consumption, and higher cost are less critical in such systems in return for faster turn around.

SUMMARY

Some embodiments may improve upon the conventional processor-based approach to achieve higher performance at lower cost and power consumption, thus creating an alternative to ASICs or FPGAs for the hardware implementation of the HDL description.

In one embodiment, logic evaluation may utilize processors with the complexity similar to a general purpose microprocessor. The processors support instructions to implement logic/arithmetic as well as control flow (branch) operations. The use of complex processors reduces data traffic (and the interconnect and power to support such traffic) and increases computational efficiency, as the processors are capable of performing complex operations on multiple-bits-wide data.

In one embodiment, a key to using a general purpose microprocessor as an execution engine for HDL programs is to compile the HDL code into a form that maps well into the instruction set of a microprocessor. In one embodiment, the compilation technique separates data flow operations from control flow operations, thus reducing the operation of the electronic system into a series of conditional data flow operations. A non-conditional data flow operation may be treated as a conditional data flow operation with the condition set to true. This embodiment exploits the fact that random logic in HDL is mostly conditional logic used to control dataflow operations. A similar datapath separation technique has been applied in other HDL analysis applications, e.g., see U.S. Pat. No. 6,145,117. Conditional data flow operations map well into the instruction set of a microprocessor and may be scheduled for maximum parallel execution by multiple processors. By controlling dataflow execution through the use of branch instructions in the processor, the amount of data traffic may be significantly reduced in some embodiments. Dataflow analysis exploits data locality of the design and further reduces the amount of data traffic in some embodiments.

The conventional technique compiles or synthesizes the HDL description into a "hardware" model comprising primitive logic functions to be executed by specialized hardware with complex and inflexible interconnect. In contrast, one embodiment compiles the HDL into a "software" program and executes the resulting program using an array of microprocessors with a streamlined interconnect.

In one embodiment, a method comprises compiling a hardware description language (HDL) description of an electronic system into a plurality of programs, each of the plurality of programs comprising a plurality of instructions that are processor-executable to realize at least a portion of the operation of the electronic system; and downloading each of the plurality of programs to an instruction memory of one of a plurality of processors. A computer accessible medium storing a plurality of instructions which, when executed, implement the method and an apparatus comprising processors to execute the plurality of programs is also contemplated.

In another embodiment, a method comprises compiling a hardware description language (HDL) description of an electronic system into a plurality of instructions that are processor-executable to realize operation of the electronic system, wherein the plurality of instructions include arithmetic/logic instructions and control flow instructions; and storing the plurality of instructions. A computer accessible medium storing a plurality of instructions which, when executed, implement the method and an apparatus comprising one or more processors to execute the instructions is also contemplated.

In another embodiment, a method comprises extracting dataflow from a hardware description language (HDL) description of an electronic system; generating arithmetic/logic instructions corresponding to the dataflow; extracting control for the dataflow from the HDL description; and generating control flow instructions corresponding to the control. A computer accessible medium storing a plurality of instructions which, when executed, implement the method and an apparatus comprising one or more processors to execute the instructions is also contemplated.

In still another embodiment, a method comprises executing a branch instruction, wherein the executing comprises evaluating a plurality of branch conditions in parallel; and selecting one of the plurality of branch conditions responsive to an encoding of the branch instruction. A corresponding apparatus is also contemplated.

In yet another embodiment, a method comprises compiling an HDL description of an electronic system, the compiling comprising mapping at least a portion of control logic extracted from the HDL description to a programmable logic block in a processor; and mapping dataflow operations and a remaining portion of the control logic, if any, to instructions to be executed by the processor. A computer accessible medium storing a plurality of instructions which, when executed, implement the method and an apparatus comprising the processor is also contemplated.

In another embodiment, an apparatus comprises a plurality of processors coupled to an interconnect. Each of the plurality of processors is configured to execute a program downloaded thereto, and each program comprises a plurality of instructions including arithmetic/logic instructions and control flow instructions that control execution of the arithmetic/logic instructions. Each program represents the operation of a portion of an electronic system described in a hardware description language (HDL). Execution of the programs by the plurality of processors collectively performs the operation of the electronic system.

BRIEF DESCRIPTION OF THE DRAWINGS

The following detailed description makes reference to the accompanying drawings, which are now briefly described.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Overview of the HDL Execution System

In one embodiment, an HDL description of an electronic system is compiled into object code (e.g. one or more programs, each program comprising a plurality of instructions in the instruction set architecture implemented by the processors), downloaded into one or more instruction memories, and executed by a processor system. The processor system may be implemented in a single chip or multiple chips in the target electronic system. The HDL may be any high level language (e.g. Verilog, VHDL, C derivatives, etc.). The instruction set architecture implemented by the processor system may support both arithmetic/logic instructions (or bit manipulation instructions) and control flow instructions (e.g. branch instructions and particularly conditional branch instructions).

Processor System Architecture

Figure 1:
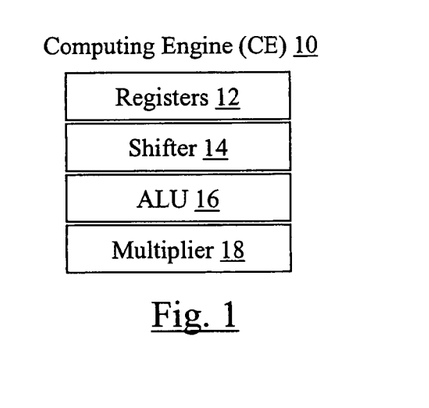
FIG. 1 is a block diagram of one embodiment of the data execution unit of a processor, comprising local registers and hardware to execute logical and arithmetic instructions. This is one embodiment of a basic computing engine.

In one embodiment, the processor system comprises an array of interconnected processors. Each processor (P) comprises one or more computing engines (CEs). As shown in FIG. 1, the basic building block of one embodiment of the illustrated processor system is a Computing Engine (CE) 10. A CE may comprise logical and arithmetic datapath hardware used to process multi-bits-wide data. As shown in FIG. 1, a CE 10 may comprise registers 12, a shifter 14, an arithmetic logic unit (ALU) 16 and a multiplier 18. Other configurations of the CE may be used in other embodiments, including supersets and/or subsets of the above components and other components, as desired.

Figure 2:
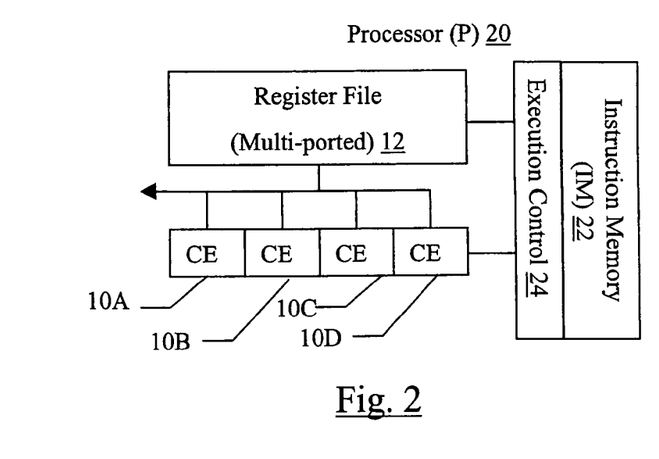
FIG. 2 is a block diagram of one embodiment of multiple computing engines sharing data through a multi-ported data storage, controlled by the instructions stored in the instruction memory, to form a processor.

As shown in FIG. 2, a processor (P) 20, in one embodiment, may comprise one or more computing engines (CEs) (e.g. CEs 10A-10D in FIG. 2), a register file (RF) 12, an instruction memory (IM) 22, and execution control 24. Each CE 10A-10D may be an instantiation of the CE 10 shown in FIG. 1, for example. In one implementation, the CEs 10A-10D may not include individual registers 12 as shown in FIG. 1, but rather may share the register file 12 as shown in FIG. 2. Thus the one or more CEs, RF, IM, and the associated control logic make up a Processor (P) as shown in FIG. 2. The multi-ported Register File (RF) may store data for multiple CE's to operate and access data in parallel. The operation of the CEs may be controlled by instructions stored in the Instruction Memory (IM) 22. The IM 22 may comprise any sort of memory (e.g. nonvolatile memory, static random access memory (SRAM), cache memory such as an instruction cache, etc.). The execution control 24 may be responsible for fetching instructions, dispatching them to the CEs 10A-10D for execution, ensuring correct result update to the RF 12, etc. The embodiment illustrated in FIG. 2 includes the IM 22 coupled to the execution control 24, which is further coupled to the register file 12 and the CEs 10A-10D. The CEs 10A-10D are further coupled to the register file 12. Any number of CEs may be included in various embodiments of the processor 20.

The processor 20 may be a pipelined machine with a highly optimized physical implementation to run at a cycle time significantly shorter than that of a typical ASIC chip, in some embodiments. Typical ASIC chips achieve high throughput at moderate cycle time through massive parallelism, resulting in complex custom hardware. Some embodiments of the system described herein may achieve equivalent or higher throughput by executing many RISC-like simple instructions in a short cycle time with multiple processors running in parallel, resulting in general purpose hardware easily re-targeted for different applications. In essence, the system described herein may achieve high throughput by time multiplexing simple hardware resources. The processor 20 may implement an instruction set architecture which, as mentioned above, may include arithmetic/logic instructions and control flow instructions.

Figure 3:
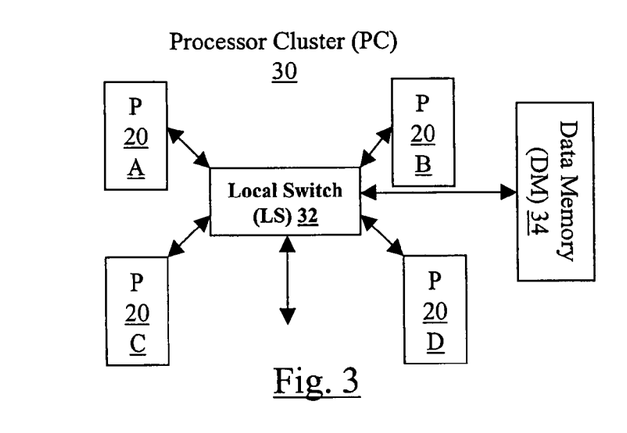
FIG. 3 is a block diagram of one embodiment of a communication architecture in which multiple processors share memory through a switching mechanism, forming a cluster of processors.
Figure 4:
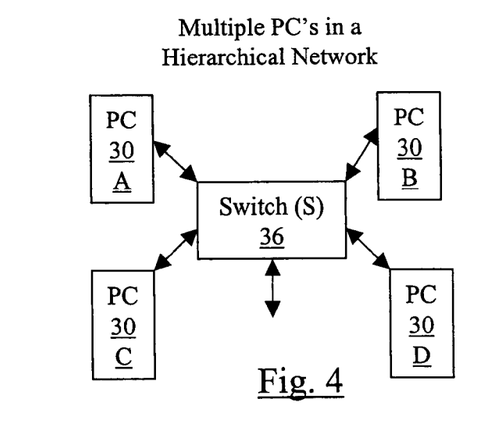
FIG. 4 is a block diagram of one embodiment of interconnecting processor clusters to form a hierarchical network of processors.

FIG. 3 illustrates a cluster 30 of processors (P) 20A-20D, e.g., in a hierarchical network, that are interconnected through a Local Switch (LS) 32 and to a Data Memory (DM) 34. Each processor 20A-20D may be an instantiation of the processor 20 shown in FIG. 2, for example. The data memory DM 34 may be used to store data too large for the RFs 12 (e.g., FIG. 3) in the processor 20A-20D. The LS 32 facilitates high bandwidth simultaneous communication between processors 20A-20D and DM 34, in one embodiment. Multiple clusters may be interconnected through another layer of switches to form a hierarchical network topology (e.g. as shown in FIG. 4, for one embodiment, with clusters 30A-30D coupled through a switch 36, where each cluster 30A-30D may be an instantiation of the cluster 30 shown in FIG. 3, for example). Processors within a given cluster 30A-30D may communicate more efficiently than processors in different clusters 30A-30D, in some embodiments (e.g. through the DM 34 included in the cluster with the processors).

Figure 5:
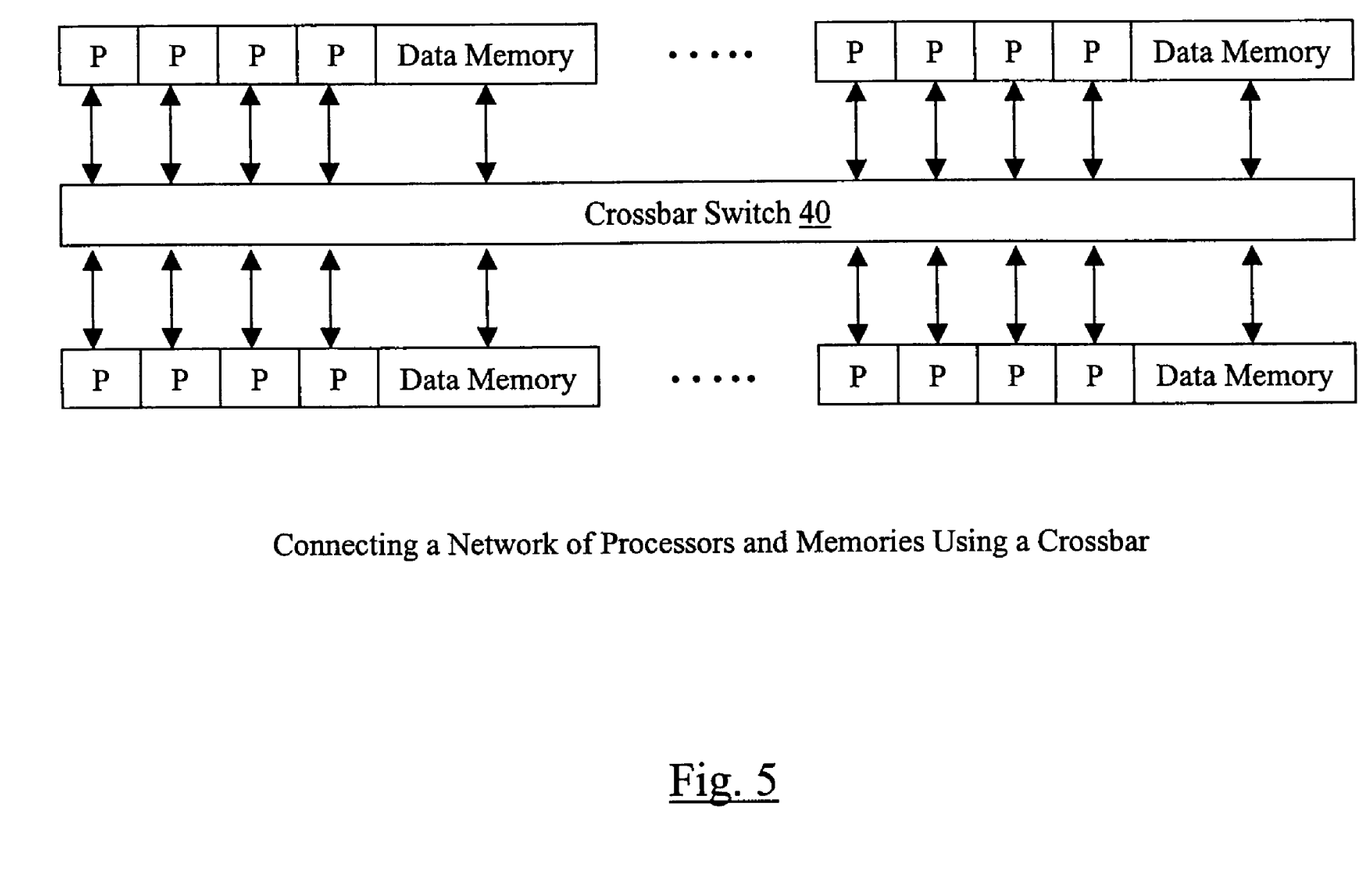
FIG. 5 is a block diagram of one embodiment of highly connected processors and memories through a crossbar switch.

Alternatively, as shown in FIG. 5, crossbar switches such as switch 40 may be used to interconnect Ps and DMs. A heterogeneous network may be formed by a combination of hierarchical and crossbar topology, in some embodiments. For example, a crossbar may be used at the lower level of hierarchy to provide maximum local interconnection, whereas a hierarchical topology may be used to interconnect large clusters at the higher level to take advantage of the fact that the number of interconnect tends to thin out at higher level of the design hierarchy of the implemented design.

One embodiment of the processor and interconnect architecture is described in co-pending application Ser. No. 10/602,292 titled "Processing System With Interspersed Processors And Communication Elements" filed on Jun. 24, 2003, patent publication no. U.S. 20040030859, whose inventors are Michael B. Doerr, William H. Hallidy, David A. Gibson and Craig M. Chase, which is hereby incorporated by reference as though fully and completely set forth herein.

While only certain embodiments of the processor and interconnect architecture have been described herein, it will be apparent to those skilled in the art using the teachings contained herein to implement alternative architectures to achieve the optimal balance between processing and communication.

Compilation Process

In one embodiment, the HDL description is parsed and elaborated to create an internal data structure of a network of the underlying logic function blocks akin to a conventional logic synthesis operation. However, unlike logic synthesis, busses, data operation, state machines, and conditional execution control blocks (such as CASE constructs, if-then constructs, etc.) are preserved. The control operations may be directly inferred from the control constructs. Data (or dataflow) operations may be inferred from the bodies of the control constructs.

In another embodiment, the logic function described in the HDL description may be separated into data (or dataflow) operations and control operations by applying data bus traversal techniques similar to those described in U.S. Pat. No. 6,145,117. For example, data busses may be identified and elements connected to the data busses may be identified as dataflow elements. Elements not coupled to the data buses may be identified as control logic. In another embodiment, all multiple-bits-wide data may be treated as data busses for the purpose of identifying dataflow operations.

After dataflow separation, the network comprises interconnected memory elements, data operators, and control logic. The network of logic function blocks may be partitioned into program partitions based on minimizing communication between partitions.

Dataflow operations are mapped into logical and arithmetic processor instructions. The control operations are mapped into branch instructions controlled by certain condition variables. The sequence of instructions forms a program suitable for execution by a processor. The programs may be assigned to processors 20 (e.g., FIGS. 2 and 3) for parallel execution based on available hardware resources in a processor 20 (e.g., FIGS. 2 and 3) and placement of processors 20 (e.g., FIGS. 2 and 3) to reduce interconnect distance as the communication overhead increases with increasing physical separation between processors. For example, programs that communicate with each other may be assigned to processors that are physically near each other on the interconnect (e.g. have lower latency communication on the interconnect, as compared to other processors on the interconnect). More generally, the assignment of programs to processors may attempt to assign those programs that communicate with each other to processors that may communicate with each other efficiently, or may even time multiplex such programs on the same processor. For example, if clusters of processors are implemented (e.g. FIG. 4 or FIG. 5), processors in the same cluster may be "near" each other or may communicate efficiently and processors in different clusters may not be "near" each other and may communicate less efficiently than processors in the same cluster. Nearness may refer to physical location (e.g. a first processor may be nearer than a second processor to a third processor if the first processor is physically located in closer proximity to the third processor than the second processor is located to the third processor). Efficiency of communication may be measured in terms of shorter latency and/or higher bandwidth, etc.

To simplify execution control complexity in some embodiments, the compiler may be responsible for resolving pipeline interlocks and data dependency between processors through instruction sequencing and/or the insertion of no-op instructions and/or explicit synchronization such as message passing. The compiler may allocate resources such as registers/memory, maximize parallelism, and schedule parallel operations to be shared among the available processors. Since each additional level of switching adds extra delay, the compiler may exploit the locality of logic function to execute highly connected operations with processors in close proximity.

Multiple tradeoffs between processor hardware resources and throughput may be implemented. In one embodiment, in the most basic compilation mode, the timing relationship of the logic functions as specified in the HDL description is preserved in the compilation process. The compiler may schedule all parallel operations to be executed concurrently among many processors. As a result, the logic function may be completed in the same time period as implied in the HDL description, provided that there is sufficient hardware to perform all parallel operations through direct hardware mapping or time-multiplexing of hardware resources.

In one embodiment, the system operates to re-time logic operations so that critical operations may be sped up or non-critical operations may be delayed to reduce hardware requirements through time-multiplexing of hardware resources. Re-timing may also be used to balance resource utilization between clock cycles to maximize processor utilization and throughput.

The result of the compilation process is a sequence of instructions for the processors on board. The instructions are stored in separate IMs throughout the chip, in one embodiment. If on-board hardware resources are sufficient for executing the parallel operations specified in the HDIL description, the IM may be shallow because it only has to contain enough instructions for all operations in a single system cycle specified by the user.

In one application of the system described herein, users compile the HDL description of a chip-under-design into a single HDL processor chip. However, the availability of additional memory locations to store instructions for additional operations beyond the minimum requirements of the chip-under-design may permit programming the processor chip to emulate a multi-chip system. Additional instructions may be used to time-multiplex hardware resources to emulate other parts of the system. Even though such emulation vehicles run slower, it may still be significantly faster and cheaper than existing emulation solutions using FPGAs, in some embodiments.

Figure 6:
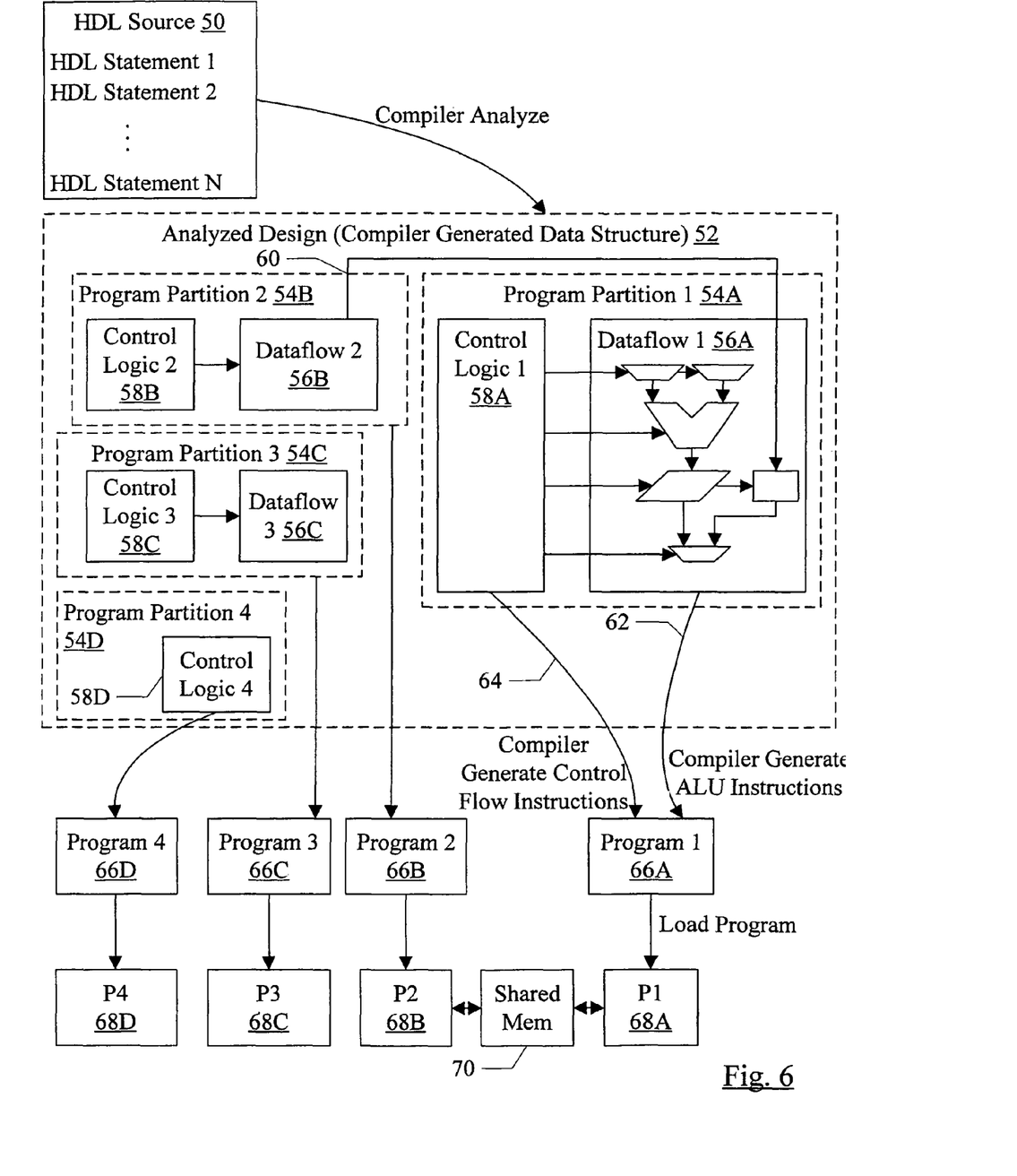
FIG. 6 is a block diagram illustrating one embodiment of compiling an HDL description into a plurality of programs.
Figure 7:
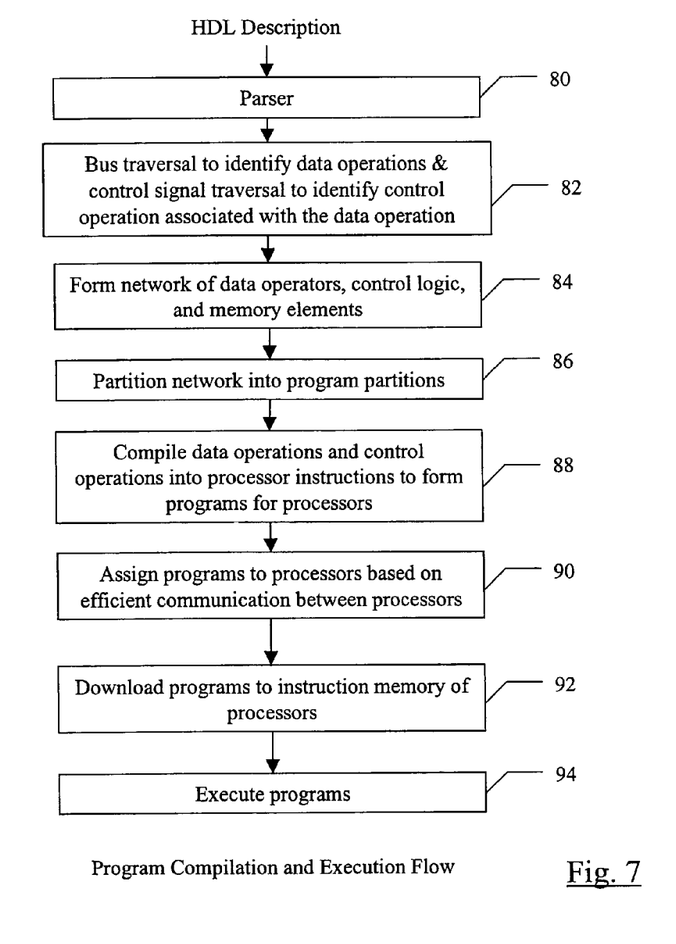
FIG. 7 is a flowchart illustrating operation of one embodiment of a compiler that compiles an HDL description into a plurality of programs.

FIGS. 6 and 7 illustrate the compilation process, for one embodiment. More particularly, FIG. 6 is a block diagram illustrating transformation of HDL source to one or more programs for execution. FIG. 7 is a high-level flowchart for one embodiment of the compiler and certain post-compilation operations. That is, the compiler may comprise a plurality of instructions which, when executed, implement the operation shown in FIG. 7 (and diagrammatically illustrated in FIG. 6).

FIG. 6 illustrates an HDL source 50 (which may comprise one or more computer files storing the HDL description of an electronic system). Generally, the HDL source 50 may comprise one or more HDL statements (e.g. HDL statements 1 to N in FIG. 6). The HDL statements, using syntax defined in the HDL, describe the electronic system and its logical operation. The HDL statements include dataflow operations, which correspond to dataflow elements in the electronic system such as adders, shifters, multiplexors (muxes), etc., performed on data stored in memory elements such as registers, flops, latches, and other clocked storage devices. Generally, the dataflow elements may receive one or more data busses (or operands) and may manipulate the operands to produce a result. Additionally, the HDL statements include control operations, which correspond to control logic (also referred to as random logic) in the electronic system that controls the dataflow elements. At least some of the random logic is connected to the dataflow elements, and thus a relationship between control logic/operations and dataflow elements/operations may be detected from the HDL source 50.

The compiler may analyze the HDL source 50 to detect the dataflow operations and control flow operations specified in the HDL source 50. That is, the compiler may parse the HDL source 50 (block 80 in FIG. 7). The compiler may traverse busses (e.g. explicitly defined busses in the HDL source 50 or any multi-bit signal values in the HDL source 50, in various embodiments) to identify the dataflow operations (e.g. data operators, memory, etc.) and may traverse control signals to identify corresponding control operations (block 82 in FIG. 7). That is, the dataflow elements may be detected as being connected to the busses, whereas the control logic may be detected as being connect to the control port(s) of the dataflow elements, to the control signals, or to other control logic. The compiler may form a network of dataflow elements and control logic to represent the electronic system described in the HDL source 50 (block 84 in FIG. 7). Blocks 80, 82, and 84 may be similar to logic transformation operations, in some embodiments (e.g. similar to the description in U.S. Pat. No. 6,145,117, incorporated herein by reference in its entirety).

The compiler may partition the network into program partitions (e.g. the program partitions 54A-54C in the data structure 52 shown in FIG. 6 and block 86 in FIG. 7). Each partition may comprise dataflow operations corresponding to dataflow elements that are connected together, and control operations corresponding to control logic that controls those dataflow elements. In FIG. 6, each of the program partitions 54A-54C includes dataflow (reference numerals 56A-56C) and control logic (reference numerals 58A-58C). In some cases, program partitions (e.g. partition 54D) may include only control logic 58D. The control logic 58D may comprise logic that does not directly control corresponding dataflow elements. Usually, the remaining control logic 58D is relatively small as compared to other control logic 58A-58C.

The partitions may be selected so that communication between partitions may be minimized as much as possible. That is, if a dataflow element that is connected to a previously detected dataflow element is located, that dataflow element/operation may be included in the same partition as the previously detected dataflow element/operation. If the dataflow element is not connected to a previously detected dataflow element, the dataflow element/operation may be included in a different program partition. Similarly, if control logic is detected that is connected to a previously detected dataflow element or to control logic that controls a previously detected dataflow element, that control logic/operation may be included in the same partition as the previously detected dataflow element. If control logic is detected that is not connected to a previously detected dataflow element nor to control logic that is connected to the previously detected dataflow element, the control logic/operation may be included in a different program partition. Connections between dataflow elements (and control logic) are explicit in HDL descriptions, and thus the connections may be readily detected.

FIG. 6 illustrates dataflow 56A as included several dataflow elements, with connections from the control logic 58A to control the dataflow elements. The dataflow elements are connected together, and may also have inputs and outputs to the program partition, in some cases. For example, in FIG. 6, the dataflow 56A receives an input from the program partition 54B (and specifically from the dataflow 56B-arrow 60). While the compiler may attempt to minimize communication between partitions, in some cases the communication may not be avoided.

The compiler may generate arithmetic/logic instructions (ALU instructions) corresponding to the dataflow operations in a given program partition (arrow 62 for partition 54A), and may generate control flow instructions such as conditional branch instructions to control execution of the ALU instructions based on the corresponding control logic (arrow 64 for partition 54A). ALU instructions may also be generated from the control logic (e.g. to compute the logic functions specified in the control logic, if the logic functions are too complex to be computed as conditions of the conditional branch instructions). The ALU instructions may include bit manipulation instructions (e.g. shifts, masks, logical instructions like AND, OR, etc.) and arithmetic instructions (e.g. add, subtract, multiply, etc.). The instructions are defined in the instruction set architecture implemented by the processors that will execute the programs generated by the compiler.

The compiler may arrange the ALU instructions and control flow instructions as a program to be executed by a processor (e.g. programs 66A-66D in FIG. 6 and block 88 in FIG. 7). Each program partition 54A-54D may result in a corresponding program 66A-66D. Generally, the control flow instructions control execution of the ALU instructions. For example, a 2-1 mux may be implemented as two sets of one or more ALU instructions. One set may propagate the first input of the 2-1 mux to the output of the mux, and the other set may propagate the second input of the 2-1 mux to the output of the mux. A conditional branch may evaluate the select and branch to one of the sets of code based on the result. Higher numbers of mux inputs may similarly be implemented with additional sets of code. As another example, a shifter may be implemented which shifts one operand by a number of bits indicated by another operand. A control signal may control whether or not a shift is enabled. A conditional branch based on the control signal may control whether or not the shift code is executed. Since only one code branch out of many possible code branches is executed, the power consumption is reduced when compared to other methods of HDL hardware realization.

The compiler (or a scheduler program that takes the programs 66A-66D output by the compiler) may assign the programs to the processors for execution (block 90 in FIG. 7). The allocation of the programs to processors may take into account the efficiency with which processors can communicate, if the corresponding programs communicate. For example, the processors P1-P4 (reference numerals 68A-68D) are shown in FIG. 6 and the processors 68A-68B are coupled to a shared memory 70. Thus, the processors 68A-68B may communicate efficiently and the programs 66A-66B (which communicate) may be assigned to those processors to communicate through the shared memory 70. The other programs 66C-66D may be assigned to the remaining processors 68C-68D. The processors 68A-68D may be instantiations of the processors 20 in any configuration (e.g. the configurations shown in FIGS. 3 and/or 4).

While the shared memory 70 is used for communication in the illustrated embodiment, other embodiments may communicate in other fashions. For example, the processors may communicate messages or control signals directly over an interconnect between the processors. Processors may communicate efficiently if they are physically near each other (e.g. low latency communication on the interconnect, as compared to latencies to other processors, may be used). In still other embodiments, processors may communicate approximately equally in terms of efficiency and programs may be assigned to processors in any desired fashion.

The compiler or scheduler may download the programs 66A-66D to the assigned processors for execution (block 92), and the processors may execute the programs (block 94). The processors each executing their assigned programs may implement the functionality of the electronic system described in the HDL source 50.

In some cases, it may be desirable to execute some control operations in configurable logic (e.g. an FPGA or other configurable logic circuitry) for additional acceleration. In such cases, the processors may include FPGA or other configurable logic circuitry that may be programmed as part of downloading a program to the processor.

It is noted that the number of program partitions may vary based on the electronic system described by the HDL source 50, the HDL source 50 itself, the size of the programs generated, etc. Additionally, the number of processors in a given apparatus for executing the programs may also vary.

Instruction Execution Control

An instruction word in the IM may comprise multiple fields. In one implementation, most bits in an instruction word may be used to control the operation of the datapath in a CE and memory accesses from RF or DM. Other fields may control sequencing of instructions. Condition Logic Arrays (CLAs), a form of programmable logic array hardware, are used in the execution control logic to evaluate HDL program variables in conditional operations, in one embodiment. In effect, the combination of IMs and CLAs implement branching operations in the processor.

The CLA evaluates branch conditions in parallel and offers execution acceleration over the conventional approach of evaluating branch conditions in a series of sequential instructions.

Figure 8:
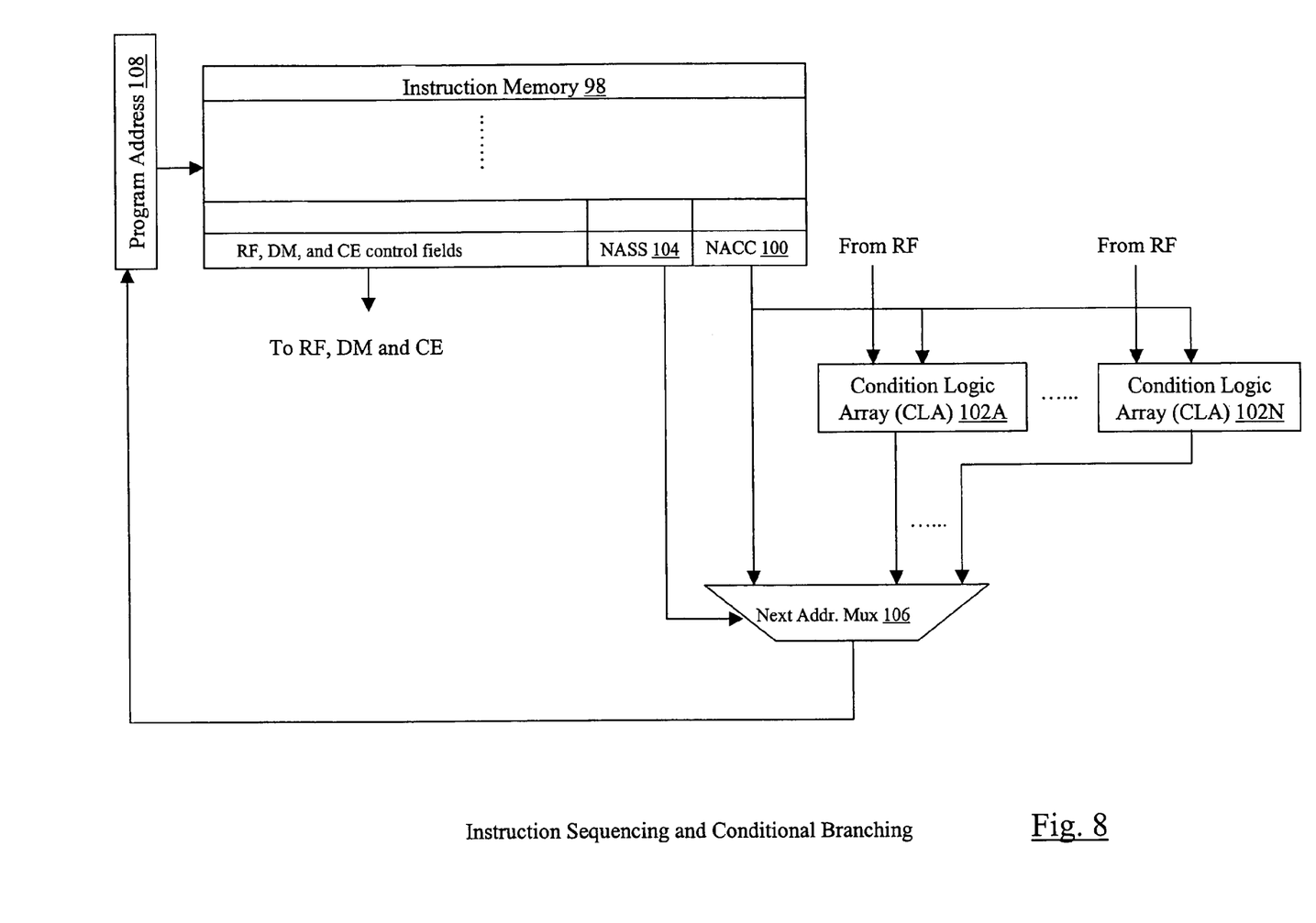
FIG. 8 is a block diagram of one embodiment of the instruction sequencing and conditional branching architecture employing programmable logic hardware, including a condition logic array (CLA) to evaluate branch condition in parallel.

FIG. 8 illustrates an exemplary branch instruction in an instruction memory 98 and hardware in one embodiment of a processor for executing the branch instruction. In the branch instruction of FIG. 8, the Next Address/Condition Code Selection (NACC) field 100 contains a selection code used to select the appropriate control variables feeding the CLA to test whether the branch condition has been satisfied. Multiple CLAs 102A-102N are used, in the illustrated embodiment, to avoid using a large and slow CLA. If the condition for branching is tested positive, the selected CLA may generate the next address on its output. That is, the compiler may configure the CLAs to generate the address of one or more ALU instructions to be executed if the branch condition is satisfied, and the address of one or more ALU instructions or other branch instructions to be executed if the branch condition is not satisfied. For example, a satisfied branch condition may indicate that an addition or shift operation is to be performed on certain operands from the RF. The address generated if the branch condition is satisfied may be the address in the IM 98 of one or more instructions implementing the dataflow operations corresponding to the adder or shifter dataflow elements. The Next Address Source Selection (NASS) field 104 selects the source of the branch address through a multiplexor (mux) 106 from the selected CLA 102A-102N. The selected address is provided to a program address register 108 to fetch the next instruction from the instruction memory 98.

The compiler allocates control variables to be evaluated by CLAs. The input/output registers of the CLA may be mapped and addressed as an extension of the RF, in one embodiment. In one embodiment, the function of each CLA is set up once upon power up and the configuration is unchanged until a new HDL program is loaded into the memory.

In a non-branch instruction, the NACC field contains the address of the next instruction, and the NASS field selects it as the next address.

In another embodiment of the invention, the CLA generates an address offset instead of the absolute branch address. The offset is then added to the current address to generate the next address.

Extended use of the CLA

It is important to note that multi-level Boolean operations, as often seen in control logic, may consume large number of processor cycles if mapped solely into bit manipulation instructions of the processors, in some cases. Therefore, in addition to decoding branch conditions, the CLA may be configured to evaluate state machine or random logic in fewer cycles than executing processor instructions. Such configuration of the CLAs for random logic evaluation may be one embodiment of the FPGA or other configurable logic being configured to implement control logic, as mentioned above with respect to FIGS. 6 and 7.

Figure 9:
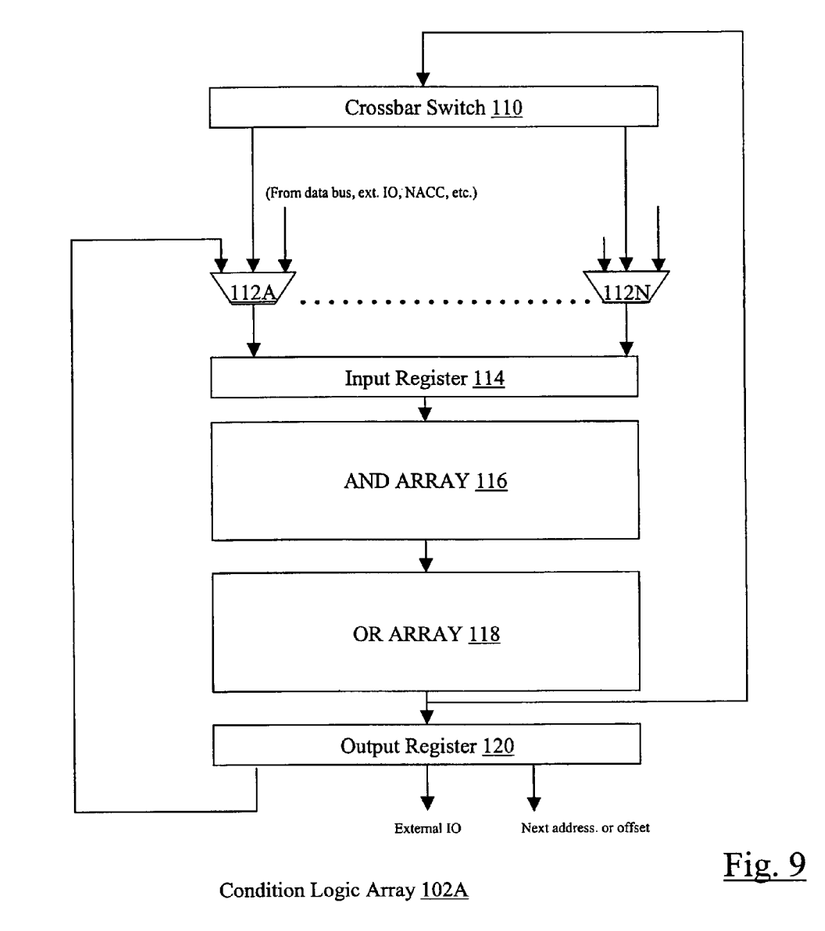
FIG. 9 is a block diagram of one embodiment of the internal structures of the CLA, containing hardware to evaluate other logic beside branch conditions.

FIG. 9 is one embodiment of a CLA (e.g. the CLA 102A). In the illustrated embodiment, the CLA includes input register 114, AND array 116, OR array 118, and output register 120. The input register 114 is coupled to the AND array 116, which is coupled to the OR array 118, which is coupled to the output register 120. Bits from the input register 114 may be selectively ANDed in the AND array 116 (which may be programmable). Bits output from the AND array 116 may be selectively ORed by the OR array 118 (which may also be programmable) to produce output bits for the output register 120. Feedback paths between the output registers and the input registers may be used to implement a state machine. (Alternatively, the output of the OR array 118 may be coupled to the input register through a crossbar switch 110 to implement multi-cycle sequential logic. Any output bit from the OR array 118 may be fed to any input bit of the input register 114 through the crossbar switch 110.

In the illustrated embodiment, muxes 112A-112N (e.g. up to one mux 112A-112N per bit in the input register 114) may be used to select between the output of the crossbar switch 110, an output register bit 120 (e.g. for finite state machine feedback) or bits from a data bus in the processor, external I/O, the NACC field 100 of the instruction memory 98, etc. The muxes 112A-112N may be programmable to configure the CLA as well.

The configuration of the CLA for state machine and random logic evaluation may be determined by the compiler based on resource utilization and performance criteria and may be programmed once upon power up or reconfigured during run time.

Input from off-chip may be fed into the CLA registers. The output registers may be connected to IO pads for off-chip communication, to provide the next address or offset to the program address 108 (e.g., FIG. 8), etc.

Computer Aided Design Tools and Environment

Design Analyzer—The Design Analyzer is a visualization tool for designers to view the micro-architecture specified in the HDL description. The Design Analyzer provides graphical representation of the hierarchy, data flow, and control flow of the design to facilitate debugging and optimization.

Simulator—The simulator simulates the function of the processor executing the HDL description with cycle accurate results.

Scheduler—The scheduler schedules datapath, memory, and IO operations for execution by assigned processors to maximize performance. A manual input mechanism is provided to manually optimize scheduling.

Compiler—The compiler compiles the HDL description into the object code suitable for execution by processors as described above. It also generates configuration data to configure hardware such as CLAs and 10.

Behavioral Synthesizer—The Behavioral Synthesizer converts un-timed higher-level description of the design, expressed in high-level language such as C and various C derivatives, into a HDL description, or directly into machine code suitable for execution by processors.

Computer Accessible Medium and Computer System

The compiler may be implemented as a program comprising a plurality of instructions which, when executed, implement the operation of the compiler as described herein. The instructions forming the compiler itself may, in some embodiments, be from a different instruction set architecture than the instruction set architecture implemented by the processors 20 (e.g., FIGS. 2 and 3). For example, the instruction set architecture of a general purpose computer may be used, and the resulting programs for the processors 20 (e.g., FIGS. 2 and 3) may be downloaded from the general purpose computer to the processors 20 (e.g., FIGS. 2 and 3). In other embodiments, the compiler instructions may be from the same instruction set architecture as the processor 20 (e.g., FIGS. 2 and 3) and the compiler may execute on the processors 20 (e.g., FIGS. 2 and 3). Similarly, the scheduler and other computer aided design tools may be implemented as programs. These programs may be stored or otherwise encoded on a computer accessible medium.

Figure 10:
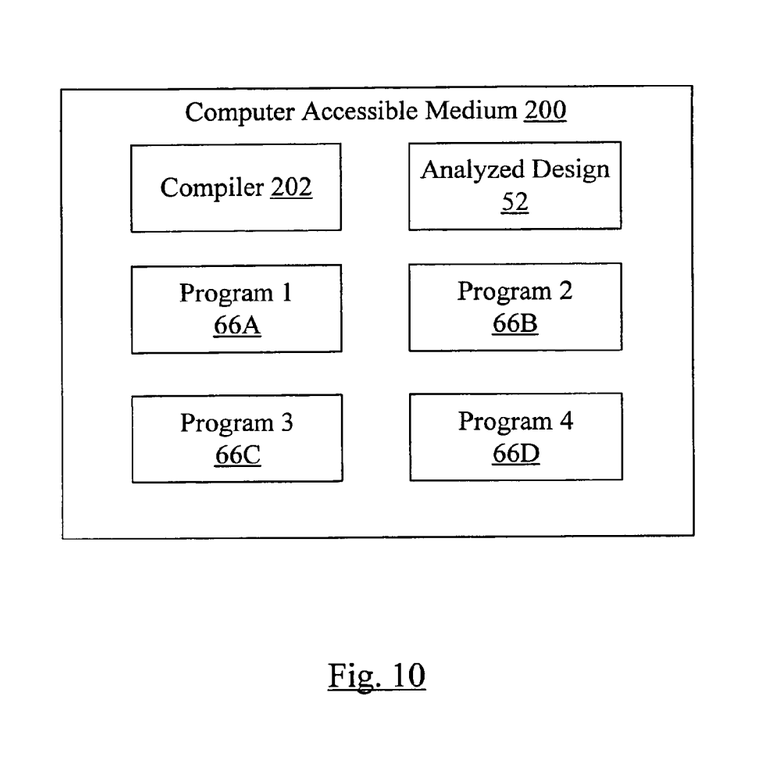
FIG. 10 is a block diagram of one embodiment of a computer accessible medium.

Turning now to FIG. 10, a block diagram of a computer accessible medium 200 is shown. Generally speaking, a computer accessible medium may include any media accessible by a computer during use to provide instructions and/or data to the computer. For example, a computer accessible medium may include storage media such as magnetic or optical media, e.g., disk (fixed or removable), tape, CD-ROM, or DVD-ROM, CD-R, CD-RW, DVD-R, DVD-RW, volatile or non-volatile memory media such as RAM (e.g. synchronous dynamic RAM (SDRAM), Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. The computer accessible medium 200 in FIG. 10 may store one or more of the compiler 202, the analyzed design data structure 52, and/or the programs 66A-66D. Generally, the computer accessible medium 200 may store any set of instructions which, when executed, implement a portion or all of the flowchart shown in one or more of FIG. 7 and/or the operation diagrammed in FIG. 6 for the compiler. The computer accessible medium 200 may further store any set of instructions which, when executed, implement the scheduler or any other computer aided design tool described above. The computer accessible medium 200 may further store any set of instructions which, when executed, implement a portion or all of the programs 66A-66D.

Figure 11:
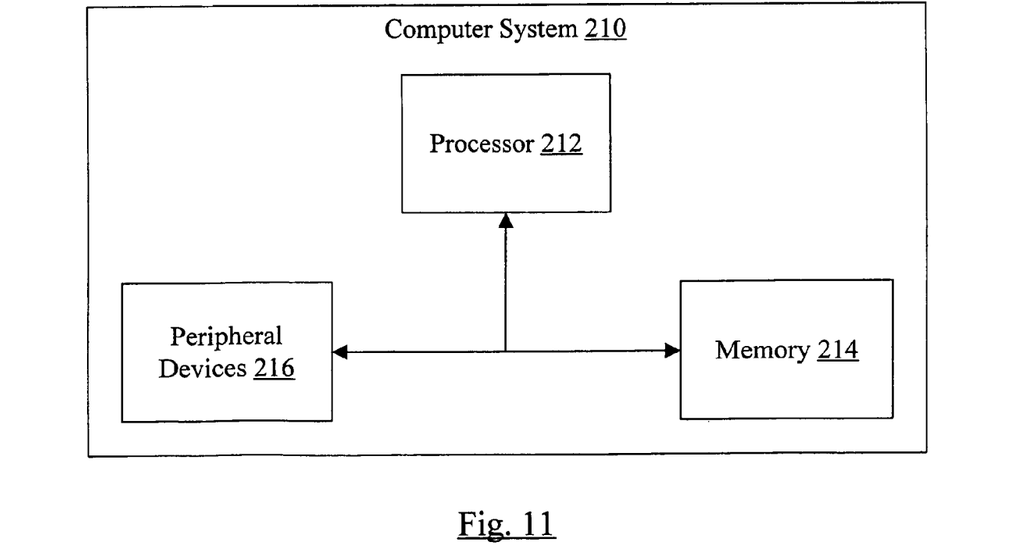
FIG. 11 is a block diagram of one embodiment of a computer system.

FIG. 11 is a block diagram of one embodiment of an exemplary computer system 210. In the embodiment of FIG. 11, the computer system 210 includes a processor 212, a memory 214, and various peripheral devices 216. The processor 212 is coupled to the memory 214 and the peripheral devices 216.

The processor 212 is configured to execute instructions, including the instructions in the compiler described herein. In various embodiments, the processor 212 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, the computer system 210 may include more than one processor.

The processor 212 may be coupled to the memory 214 and the peripheral devices 216 in any desired fashion. For example, in some embodiments, the processor 212 may be coupled to the memory 214 and/or the peripheral devices 216 via various interconnect. Alternatively or in addition, one or more bridge chips may be used to couple the processor 212, the memory 214, and the peripheral devices 216, creating multiple connections between these components The memory 214 may comprise any type of memory system. For example, the memory 214 may comprise DRAM, and more particularly double data rate (DDR) SDRAM, RDRAM, etc. A memory controller may be included to interface to the memory 214, and/or the processor 212 may include a memory controller. The memory 214 may store the instructions to be executed by the processor 212 during use (including the instructions implementing the software described herein), data to be operated upon by the processor 212 during use, etc.

Peripheral devices 216 may represent any sort of hardware devices that may be included in the computer system 210 or coupled thereto (e.g. storage devices, optionally including a computer accessible medium 200, other input/output (I/O) devices such as video hardware, audio hardware, user interface devices, networking hardware, etc.). In some embodiments, multiple computer systems may be used in a cluster.

Numerous variations and modifications will become apparent to those skilled in the art once the above disclosure is fully appreciated. It is intended that the following claims be interpreted to embrace all such variations and modifications.

What is claimed is:

1. A method comprising:
    compiling a hardware description language (HDL) description of an electronic system into a plurality of programs, each of the plurality of programs comprising a plurality of instructions that are processor-executable to realize at least a portion of the operation of the electronic system, wherein said compiling comprises:
        separating dataflow elements described in the HDL description from control logic described in the HDL description;
        generating at least a first set of arithmetic/logic instructions based on the dataflow elements and a second set of control flow instructions based on the control logic, wherein the first set of instructions does not comprise control flow instructions, and wherein the second set of instructions does not comprise arithmetic/logic instructions; and
        arranging the first set of arithmetic/logic instructions and the second set of control flow instructions into a corresponding plurality of program partitions, wherein each program partition comprises dataflow operations corresponding to respective dataflow elements that are connected together, and control operations corresponding to control logic that controls the respective dataflow elements; and
    downloading each of the plurality of program partitions to an instruction memory of one of a plurality of processors;
    wherein the plurality of program partitions are executable on the plurality of processors.

2. The method as recited in claim 1, further comprising:
    executing the plurality of programs on the plurality of processors.

3. The method as recited in claim 1, wherein said downloading comprises downloading a first program of the plurality of programs and a second program of the plurality of programs to a first processor of the plurality of processors.

4. The method as recited in claim 3, wherein said executing comprises time-multiplexing execution of the first program and the second program on the first processor.

5. The method as recited in claim 1, further comprising a first program of the plurality of programs and a second program of the plurality of programs communicating during the execution.

6. The method as recited in claim 5, wherein said communicating is through a shared memory between a first processor executing the first program and a second processor executing the second program.

7. The method as recited in claim 5, further comprising: executing the first program on a first processor of the plurality of processors and executing the second program on a second processor of the plurality of processors that is near the first processor.

8. The method as recited in claim 5, further comprising: executing the first program on a first processor of the plurality of processors and executing the second program on a second processor of the plurality of processors that is able to communicate efficiently with the first processor.

9. The method as recited in claim 1 wherein the first set of arithmetic/logic instructions, when executed, perform the operation of the dataflow elements in one of the plurality of program partitions, wherein the second set of control flow instructions, when executed, control execution of the plurality of arithmetic/logic instructions in one of the plurality of program partitions, and wherein the method further comprises:

creating one of the plurality of programs using the first set of arithmetic/logic instructions and the second set of control flow instructions.

10. A non-transitory computer accessible medium storing a plurality of instructions which, when executed, implement the method as recited in claim 1.

11. A method comprising:

extracting dataflow from a hardware description language (HDL) description of an electronic system;

generating at least a first set of arithmetic/logic instructions corresponding to the dataflow, wherein the first set of arithmetic/logic instructions does not comprise control flow instructions;

extracting control from the dataflow from the HDL description;

generating at least a first set of control flow instructions corresponding to the control, wherein the first set of control flow instructions does not comprise arithmetic/logic instructions;

assembling a plurality of programs from the at least a first set of arithmetic/logic unit instructions and the at least a first set of control flow instructions;

arranging the first set of arithmetic/logic instructions and the first set of control flow instructions into a corresponding plurality of program partitions, wherein each program partition comprises dataflow operations corresponding to respective dataflow elements that are connected together, and control operations corresponding to control logic that controls the respective dataflow elements; and     downloading each of the plurality of program partitions to an instruction memory of one of a plurality of processors;

wherein the plurality of program partitions are executable on the plurality of processors.

12. A non-transitory computer accessible medium storing a plurality of instructions which, when executed, implement the method as recited in claim 11.

\* \* \* \* \*

UNITED STATES PATENT AND TRADEMARK OFFICE
CERTIFICATE OF CORRECTION

| | | |
|---|---|---|
| PATENT NO. | : 8,230,408 B2 | Page 1 of 1 |
| APPLICATION NO. | : 11/168794 | |
| DATED | : July 24, 2012 | |
| INVENTOR(S) | : Tommy Kinming Eng | |

It is certified that error appears in the above-identified patent and that said Letters Patent is hereby corrected as shown below:

In the Claims:

COLUMN 14, Line 48 (Claim 5.), please delete "comprising a" and substitute -- comprising: a --.

COLUMN 16, Line 9 (Claim 11.), please delete "first" and substitute -- second --.

Signed and Sealed this
Twenty-seventh Day of November, 2012

David J. Kappos
*Director of the United States Patent and Trademark Office*